United States Patent [19]

Dreier

[11] Patent Number: 4,731,868
[45] Date of Patent: Mar. 15, 1988

[54] CIRCUITRY IN A SCANNING RECEIVER FOR SPEEDING UP THE GENERATION OF A RECEPTION OR NON-RECEPTION CRITERION

[75] Inventor: Ernst Dreier, Jegensdorf, Switzerland

[73] Assignee: Autophon AG, Solothurn, Switzerland

[21] Appl. No.: 798,399

[22] Filed: Nov. 15, 1985

[30] Foreign Application Priority Data

Nov. 15, 1984 [CH] Switzerland .................. 5459/84

[51] Int. Cl.$^4$ ............................................... H04B 1/10
[52] U.S. Cl. ..................................... 455/161; 455/222; 455/226; 455/296
[58] Field of Search .................. 455/161, 222–226, 455/229, 296, 303; 375/102, 104; 328/163, 165; 324/57 N

[56] References Cited

U.S. PATENT DOCUMENTS

| | | | |
|---|---|---|---|
| 3,961,268 | 6/1976 | Hansen | 455/223 |
| 4,378,605 | 3/1983 | Baumann et al. | 455/303 |
| 4,498,195 | 2/1985 | Ooi et al. | 455/303 |

FOREIGN PATENT DOCUMENTS

| | | |
|---|---|---|
| 27365 | 4/1981 | European Pat. Off. . |
| 82/00552 | 2/1982 | PCT Int'l Appl. . |

*Primary Examiner*—Michael A. Masinick
*Attorney, Agent, or Firm*—Oblon, Fisher, Spivak, McClelland & Maier

[57] ABSTRACT

Reception or non-reception of a signal is detected on the basis of whether or not a certain noise level is reached at the receiver output. Measuring periods are formed, during each of which the charge of a capacitor changes from a fixed value to a value dependent upon the momentary noise. The time from the beginning of the measuring period until a certain state of charge is reached is compared with a reference time, and a receive criterion is produced when the time dependent upon the noise is shorter than the reference time. The reference time may be obtained in a manner similar to the way in which the first-mentioned time is produced. When both times are thus obtained in an analogous manner, not only the presence but also the absence of a signal can be detected much more rapidly than heretofore.

4 Claims, 3 Drawing Figures

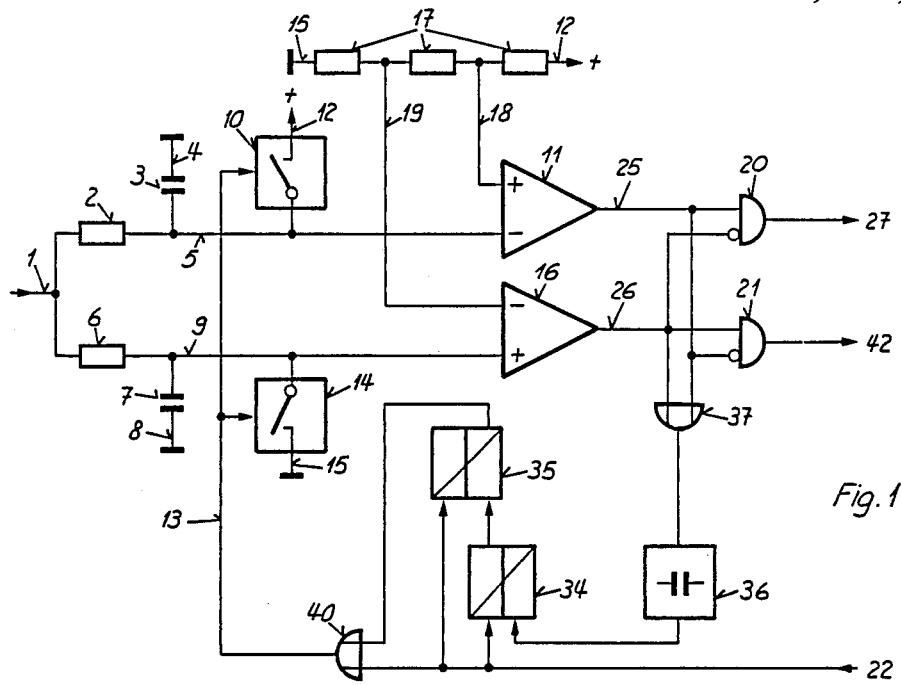
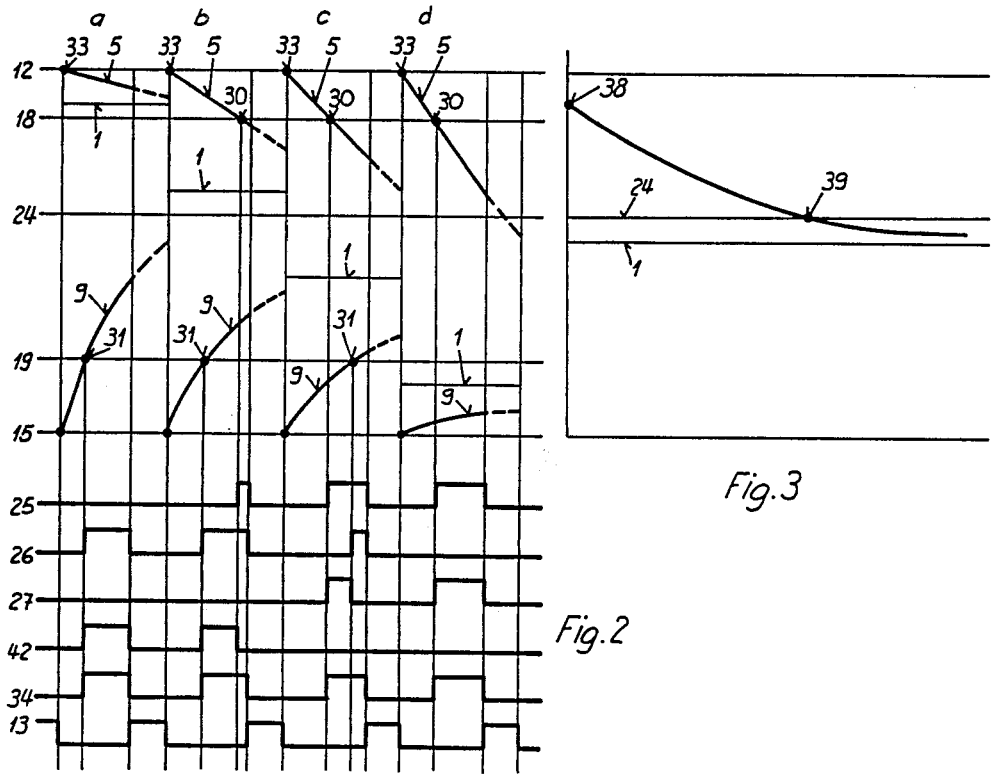
Fig.1
Fig.2
Fig.3

CIRCUITRY IN A SCANNING RECEIVER FOR SPEEDING UP THE GENERATION OF A RECEPTION OR NON-RECEPTION CRITERION

BACKGROUND OF THE INVENTION

This invention relates to wireless transmission, and more particularly to circuitry in a wireless signal receiver for generating a receive criterion, i.e., for detecting the reception or non-reception of a signal, especially for receivers having alternating reception on several channels and facilities for seeking a free or an occupied channel.

There is often a need in receivers of wireless signals for binary detection of the reception or non-reception of a signal. It is generally customary to deduce the presence or absence of the signal from the intensity of the noise at the receiver output. In such cases, part of the output signal is led through a high-pass filter or a band-pass filter, and those frequencies contained in the noise which are above the speech band are processed into a noise criterion taking the form of a DC potential, the magnitude of which is approximately proportional to the intensity of the noise. By means of a comparison device which compares the noise criterion with an arbitrarily determined limit potential, a receive criterion is produced insofar as the noise criterion is lower than the limit voltage. Most often, the noise criterion is used solely for blocking the output of the receiver in the absence of a signal in order to avoid a disturbance due to the noise.

Since the noise intensity fluctuates, the noise potential must be integrated for a certain length of time before it is compared with the limit potential in order to avoid fluttering of the receive indication if the noise criterion is of the same order of magnitude as the limit potential. This integration is known to be achieved by means of a capacitor to which the noise potential is supplied across a resistor.

However, as a result of the insertion of such a capacitor, the beginning and end of the reception of a signal are detected with a lag dependent upon the strength of the arriving or disappearing signal. In the case of a newly arriving signal, the weaker it is, and thus the smaller the decrease in the potential of the noise criterion, the greater the lag. When the noise criterion is only slightly below the limit voltage, there is a very great lag. Conversely, when a strong signal disappears, hence when the decrease of the noise criterion is large, the lag is likewise great, whereas it is only brief upon disappearance of a weak signal, where the corresponding noise criterion is only slightly below the limit potential.

If the non-reception of a signal is supposed to be detected at a certain time, then in order to obtain a reliable result, it is necessary to wait for a time which exceeds the time it takes to detect the reception of a signal in the most unfavorable case, and which is therefore also long.

If the noise criterion is used only to control the blocking of the receiver output known as "squelch," it is above all the long lag time after the cessation of reception of a noise-free signal which is disturbing because the noise occurring at the receiver output during such a time lag is annoying. Contrary thereto, when reception of a weak and hence noisy signal is briefly interrupted, it is the quick response of the squelch which is disturbing because, on account of the delayed cancellation of the blocking in this case, the intelligibility suffers. Circuitry in which the dependence of the lag upon the strength of a disappearing signal is the opposite of the relationship, as described above, is disclosed in International (PCT) Application Publication No. WO 82/00552, for example.

In a receiver by means of which a group of channels is to be scanned for an occupied channel measuring periods are formed, each of these periods always begins with the switching over to a new channel. According to the prior art, in order to create a clear situation at the beginning of each measuring period, it is customary to apply briefly to the input of the comparator a (low) potential corresponding to the reception of a strong signal, whereupon this potential then, in accordance with the mentioned integration time constant, tends to the value corresponding to the noise occurring. As soon as this rising potential exceeds the limit voltage, a pulse is transmitted, brought about by the comparator, for switching the receiver to another channel and thus for initiating a new measuring period.

If, in this case, a weak signal is received, which is not supposed to be acknowledged and where the potential corresponding to the noise is only slightly above the limit voltage, it takes a long time from the beginning of the measuring period to the transmission of the mentioned pulse, which is a disadvantage when a fairly large number of channels are supposed to be scanned.

In an arrangement for seeking free channels, problems corresponding to the aforementioned time problems likewise arise, according to the prior art, when signals are received where the potential derived from the noise voltage is only slightly below the limit voltage.

An arrangement operating according to these principles and hence suffering from the mentioned disadvantages in the speed of the mode of operation, intended exclusively for scanning for occupied channels, is described in European Patent Application Publication No. 0 027 365.

It is an object of this invention to provide improved circuitry by means of which, during alternating reception on different channels, the time for detecting the reception of a signal or for detecting the non-reception of a signal is substantially reduced as compared with conventional and obvious circuit arrangements, although in both cases the reception of weak signals is also taken into consideration.

BRIEF DESCRIPTION OF THE DRAWING

A preferred embodiment of the invention will now be described in detail with reference to the accompanying drawing, in which:

FIG. 1 is a simplified diagram of the circuitry,

FIG. 2 is a graph showing, relative to four different levels of the noise criterion, the shapes of several potential curves as a function of time in the circuitry of FIG. 1, assuming as a fiction that the noise criterion varies in successive measuring periods, and FIG. 3 is a graph showing the time conditions upon reception of a weak signal in a prior art arrangement.

DETAILED DESCRIPTION OF THE INVENTION

A processing stage for noise in a receiver (not shown) produces at its output a noise criterion, the potential of which is highest when there is no signal, at the input of the receiver, and lowest when a strong signal arrives, so that the noise at the output disappears accordingly. This noise criterion is supplied to the circuit of FIG. 1 at an input 1. Input signals of different strengths result in noise criteria at input 1 having potentials situated between two extremes.

The noise criterion at input 1 is supplied across a resistor 2 to the second terminal 5 of a first capacitor 3, on the one hand, and across a resistor 6 to the second terminal 9 of a second capacitor 7, on the other hand. First terminals 4 and 8 of capacitors 3 and 7, respectively, are grounded. Resistors 2 and 6 are preferably of the same value, as are capacitors 3 and 7, so that the two time constants are likewise of the same magnitude. However, this is by no means a requirement for carrying out the inventive concept.

The potential at second terminal 5 of capacitor 3 is also applied to an electronic switch 10 and to a first input of a first comparator 11. Switch 10 connects the positive potential 12, hereafter called base potential, to potential 5 when it is made conductive via its control input by means of a control signal 13. By means of the same control signal 13, potential 9 is connected to a ground potential 15, hereafter likewise called base potential, via a switch 14. Potential 9 is also applied to a first input of a second comparator 16.

The second inputs of comparators 11 and 16 are connected to fixed potentials 18 and 19, respectively, produced with the aid of a voltage divider 17 and acting as threshold potentials. Potentials 18 and 19 lie between base potentials 12 and 15, threshold potential 18 being closer to positive potential 12, and threshold voltage 19 applied to comparator 16 being closer to zero potential 15.

The comparators are connected in such a way that comparator 11 transmits a positive potential at its output 25 when threshold voltage 18 is more strongly positive than potential 5, and comparator 16 is connected so that it transmits a positive potential at its output 26 when potential 9 is more strongly positive than threshold voltage 19.

Outputs 25 and 26 of comparators 11 and 16 each run to two inputs of two AND-gates 20 and 21, output 25 being applied to a normal input of gate 20 and to an inverting input of gate 21, whereas output 26 runs to a normal input of gate 21 and to an inverting input of gate 20.

As a result of potentials 25 and 26 being supplied to normal and inverting inputs of gates 20 and 21, a positive potential does not appear at output 27 of gate 20 unless there is only a signal 25, whereas no signal appears at output 42 of gate 21 unless there is only a signal 26. When neither or both of these signals are present, no signals appear at outputs 27 and 42.

Outputs 25 and 26 of the comparators also run to an OR-gate 37, the output of which is connected via a differentiator 36 to the control input of a monostable multivibrator 34, the latter being enabled by the leading edges of the signals transmitted by gate 37. When multivibrator 34 returns to its rest position, it enables another monostable multivibrator 35. As long as multivibrator 35 is in its active position, it transmits a signal to the input of an OR-gate 40. At the output of gate 40 there appears the control signal 13 mentioned earlier. This control signal is thus always generated after a time lag caused by multivibrator 34 when, starting from the state of absence of output signals at comparators 11 and 16, the polarity of the potential difference changes at the inputs of one of these comparators. By means of this control signal, switches 10 and 14 are actuated in the manner already described. When multivibrator 35 returns to its rest position, control signal 13 is terminated.

Control signal 13 can also be generated by a sync signal supplied from outside at reference numeral 22, this sync signal disabling monostable multivibrator 34 and 35 if they are enabled.

In FIG. 2, the shape of the potentials at terminals 5 and 9 as a function of time is shown for four different values of potential 1 of the noise criterion, each during one measuring period. Base potentials 12 and 15, which remain unchanged, and threshold potentials 18 and 19 produced by voltage divider 17 appear as horizontal lines. Limit potential 24 determines whether a signal reception should be accepted or not in that, when noise criterion 1 decreases to a value above limit 24, no reception and hence no occupying of the channel tuned should be supposed, but in the event of a decrease to a value below limit 24, occupying of the respective channel should be supposed. It is preferable to choose the ratio of the difference between potentials 12 and 18 to the difference between potentials 18 and 24 to be equal to the ratio of the difference between potentials 15 and 19 to the difference between potentials 19 and 24.

In the graph of FIG. 2, part a represents no reception, part b a very weak signal which should not produce a receive criterion, part c a weak signal which should produce a receive criterion, and part d a strong signal. The time is divided by means of control signal 13 into measuring periods each situated between two successive control signals. The length of the measuring periods is determined by the formation of the control signal, to be explained below. During each control signal, switches 10 and 14 are conductive, capacitor 3 being charged, and connection staking the positive potential 12. Capacitor 7, on the other hand, is discharged, and connection 9 taking zero potential 15.

As soon as switches 10 and 14 go into interruping state at the beginning of a measuring period, capacitor 3 is discharged and capacitor 7 charged, the rate of change of potentials 5 and 9 and the final state of the charging and discharging being governed by potential 1 of the noise criterion, and the time constant of said rate being determined by capacitor and resistor. Each measuring period begins with the termination of the control signal. The respective moments are designated by reference numeral 33 in FIG. 2.

In part a of FIG. 2, potential 1 is higher than potential 18, so that comparator 11 does not transmit any output signal 25 within the measuring period. Potential 9 exceeds threshold voltage 19 at point of intersection 31 during charging of capacitor 7, whereby comparator 16 delivers a positive potential at its output 26. A criterion indicating the non-reception of a signal at the receiver input thereupon appears at output 42.

The shape of the potential curves in part b of FIG. 2 is based upon a potential 1 of the noise criterion situated between threshold potential 18 and limit voltage 24. At the moment designated 31, comparator 16 again produces an output signal, the same operations taking place as described with reference to part a. At moment 30, occurring after moment 31, potential 5 falls below potential 18 during discharge of capacitor 3. This has no effect, however, because owing to the positive potential 26, potential 25, which likewise assumes a positive value at moment 30, cannot influence the output of gate 20. In this case, too, a criterion for the non-reception of a receiver input signal thus appears at output 42. If potential 1 were closer to potential 18, control signal 13 would occur before potential 5 dropped below threshold 18. The situation would then correspond to that of part a.

Part c of FIG. 2, shows the case of the noise criterion potential 1 which is below threshold potential 24. Intersection 30 takes place chronologically before intersection 31, whereupon potential 25 becomes positive before potential 26. When potential 25 changes to the positive value, the potential at output 27 also changes in the same way, thus indicating a sufficiently strong signal at the input of the receiver. The output signal produced at comparator 16 at moment 31 remains without effect. In this case, the information of control signal 13 described in connection with part a takes place based upon signal 25, appearing at the output of comparator 11 and arriving first via gate 37.

As regards a non-illustrated input potential 1 situated very close to potential 19, the same observations as set forth with reference to part b apply analogously.

As shown in part d, when reception is very good, potential 1 of the noise criterion remains below threshold voltage 19, so that there is no point of intersection 31. The conditions are then the same as described with reference to part c.

In a borderline case in which noise criterion 1 exhibits precisely the potential 24, intersections 30 and 31 theoretically occur (in a manner not shown) at the same time, and it is pure chance whether reception is detected or not. Since the noise level always fluctuates slightly, just as many negative as positive receive criteria occur, considered over an interval of several measuring periods, when there is a borderline value. In order to obtain a reliable receive indication in the borderline area, it would be possible—in a manner known per se but not shown—always to integrate the criteria 27 and 42 over a certain length of time and to form a receive criterion resulting from the majority of the criteria occurring during several successive measuring periods.

Within certain limits, moments 30 and 31 can be influenced by appropriate fixing of threshold potentials 18 and 19 and by the choice of the time constants.

Thus, conditions at the receiver input being equal, a pulse train having pulses spaced according to the measuring periods is generated at either output 27 or output 42, the length of the measuring periods being governed by the time necessary in each case for detecting the reception or non-reception of a signal.

If the circuitry is used with an arrangement for channel switchover in order to seek out either a free channel or an occupied one from a group of channels, the beginning of a measuring period must always be synchronized with the end of the switchover. This switchover will be triggered by a pulse 27 or a pulse 42, depending upon the type of channel search, a pulse being applied to input 22 (in a manner not shown) insofar as the switchover which has taken place owing to such triggering is terminated. By means of the pulse applied to input 22, and regardless of the momentary state of charge of capacitors 3 and 7, a new measuring period is initiated. The time constants of multivibrators 34 and 35 will preferably chosen in a manner that, taken together, they are somewhat longer than the time necessary for a channel switchover. This prevents disturbing pulses from appearing at outputs 27 or 42 during the switchover.

The main advantage of this invention over the prior art can best be judged from FIG. 3. This graph shows the shape of the curve of a noise criterion potential as a function of time for a noise criterion having a potential situated only slightly below limit potential 24 and thus corresponding to a weak reception signal. It is assumed that for integration of the noise criterion, the same time constant is effective as was presupposed in FIG. 2, and that the signal reaches the receiver at moment 38 or that the receiver is tuned to an occupied channel at moment 38. As may be seen from FIG. 3, the potential of the noise criterion does not fall below limit potential 24 until point 39. The interval of time between points 38 and 39, i.e., the time for detecting the reception of a signal, is several times as long as the corresponding times in the arrangement according to the present invention. For detecting the absence of an input signal, too, it would be necessary with a prior art arrangement to wait at least a length of time corresponding to the interval between points 38 and 39 after switching on a certain channel. If the arrangement is used in the manner described for seeking a free or an occupied channel, it is possible to scan the channels at the rate of about 50 per second.

The invention is naturally not limited to the foregoing preferred embodiment. If only quick detection of weak signals or only quick detection of non-reception is necessary, the assessment of the time from the beginning of the measuring period to the intersection 30 or 31 may also be made by comparison with a fixed, unchanging reference time, preferably obtained by counting oscillations, whereby one of the capacitors and one of the comparators could be dispensed with. According to the mentioned task, the components of the upper or lower half of FIG. 1 would then be omitted. In circuitry of this kind, the clock pulses might also be produced by a pulse generator having fixed timing.

The time constants formed from capacitor 3 with the appurtenant resistor 2, on the one hand, and from capacitor 8 with the appurtenant resistor 6, on the other hand, need not be of the same value; for every selection of such time constants, it is possible to fix threshold values 18 and 19 in such a way that the desired conditions are met.

Since the intensity of the noise depends upon the feed voltage, the temperature, and the ageing of the components, the accuracy of the receive indication could be improved by selecting a value for potential 12 proportional to the noise level in the absence of an input signal, instead of a fixed value.

Evaluation of the time difference between the appearances of intersections 30 and 31 may naturally also be carried out in some other way than described above; in particular, the whole circuit connected to the comparators and the sync input may be laid out in a way differing substantially from the foregoing embodiment and may take the form of an integrated circuit.

The fixed potential to which the capacitors are connected need not be the same for both capacitors nor be ground. If another potential is used, discharge takes place instead of the charging described in the above embodiment, and vice versa; this makes no difference fundamentally.

What is claimed is:

1. Circuitry in a wireless signal receiver for generating a receive criterion, i.e. for detecting the reception or non-reception of a signal, for receivers being alternating on reception on several channels and having facilities for seeking a free or an occupied channel, of the type having first circuit means for generating a DC signal as a noise criterion proportional to the strength of the noise at the receiver output, for generating a criterion for the reception or the non-reception of a wireless signal if the value of said noise criterion is below or above a certain limit potential, further having second circuit means dividing the time into measurement periods, a capacitance with a first and a second terminal, the first terminal being connected with any fixed potential, third circuit means, controlled by said second circuit means, for connecting said second terminal of said capacitance, before the beginning of a measurement period, to a base, potential having one of the possible extreme values of the noise criterion, and during the measurement period via a resistance to the potential of the noise criterion, the improvement comprising:

fourth circuit means, including a digital output, for comparing the potential at said second terminal with a threshold potential having a value between said base potential and said limit potential, the potential appearing at said digital output depending solely upon the polarity of the difference between the potentials to be compared, fifth circuit means with an input, connected to the output of the fourth circuit means determining the reception or non-reception of a signal based upon the moment at which a change of the potential at its input occurs within the respective one of said measuring periods.

2. The circuitry of claim 1, further comprising sixth circuit means for generating a reference time running from the beginning of each of said measuring periods, and said fifth circuit means selectively generating said receive criterion in dependence upon the chronological order of the end of said reference time and the occurrence of said change of potential at the output of the fourth circuit means.

3. The circuitry of claim 2, comprising a first group consisting of a said capacitance, a said third circuit means including a resistance and a said fourth circuit means and a second group consisting of another said capacitance, another of said third circuit means including another resistance and another said fourth circuit means, each of said groups has its individual base potential and respective threshold potential, the two base potentials belonging to the two groups having the two said extreme values and thus being different, said fifth circuit means comparing the period of time elasping in one of the two groups between the beginning of a measuring period and the moment of said change of potential at the output of the fourth circuit means with the respective period of time elasping in the other group such as the period occuring in one group is the reference for the period occuring in the other group.

4. The circuitry of claim 3, wherein in each of said groups the time constants resulting from the said capacitance and the said resistance are equal in each of said groups and the ratio of the difference between said limit potential and the base potential to the difference between said threshold potential and said limit potential also being the same for said two groups.

* * * * *